United States Patent [19]
Kirkman

[11] Patent Number: 6,137,168
[45] Date of Patent: Oct. 24, 2000

[54] SEMICONDUCTOR PACKAGE WITH TRACES ROUTED UNDERNEATH A DIE

[75] Inventor: Scott Kirkman, Laguna Beach, Calif.

[73] Assignee: LSI Logic Corporation, Milpitas, Calif.

[21] Appl. No.: 09/428,164

[22] Filed: Oct. 27, 1999

Related U.S. Application Data

[63] Continuation of application No. 09/006,356, Jan. 13, 1998, Pat. No. 6,064,113.

[51] Int. Cl.$^7$ .................................................. H01L 23/52
[52] U.S. Cl. .......................... 257/691; 257/698; 257/700; 257/774; 257/784; 257/692; 361/794; 361/777; 361/780
[58] Field of Search .................................... 257/691, 698, 257/700, 774, 784, 692; 361/794, 777, 780

[56] References Cited

U.S. PATENT DOCUMENTS

| | | | |
|---|---|---|---|
| 5,399,903 | 3/1995 | Rostoker et al. ....................... | 257/666 |
| 5,640,048 | 6/1997 | Selna ....................................... | 257/738 |

*Primary Examiner*—Tom Thomas
*Assistant Examiner*—Luan Thai

[57] ABSTRACT

A semiconductor device package is presented for housing an integrated circuit which includes bonding fingers located within a conductive ring structure and routed to device terminals on an underside surface of the semiconductor device package. The semiconductor device package includes a die area defined upon a planar upper surface, a conductive ring surrounding the die area, and a first set of bonding fingers arranged within the conductive ring. The die area is dimensioned to receive the integrated circuit. The conductive ring may be a power ring or a ground ring. The conductive ring and the first set of bonding fingers are located within a first signal layer adjacent to the upper surface. A set of bonding pads which serve as device terminals reside within a second signal layer adjacent to a planar underside surface. The semiconductor device package also includes a first set of signal traces connected to bonding fingers within the first signal layer, a second set of signal traces connected to bonding pads within the second signal layer, and vias connecting members of the first and second sets of signal traces. The signal traces and vias form signal paths between members of the first set of bonding fingers and corresponding bonding pads which "loop back" upon themselves. The semiconductor device package also includes a combined power and ground plane configured to stabilize the impedances of the "loop back" signal paths.

4 Claims, 5 Drawing Sheets

SEMICONDUCTOR PACKAGE WITH TRACES ROUTED UNDERNEATH A DIE

RELATED APPLICATIONS

This application is a continuation of U.S. Ser. No. 09/006,356, filed Jan. 13, 1998, entitled "Semiconductor Device Package Including A Substrate Having Bonding Fingers Within An Electrically Conductive Ring Surrounding A Die Area And A Combined Power And Ground Plane To Stabilize Signal Path Impedances", now U.S. Pat. No. 6,064,113.

BACKGROUND OF THE INVENTION

1. Field of Invention

This invention relates to semiconductor device packages, and more particularly to grid array packages using electrically conductive signal traces to form signal paths between bonding fingers and device terminals.

2. Description of Related Art

During manufacture of an integrated circuit (e.g., a microprocessor), signal lines formed upon the silicon substrate which are to be connected to external devices are terminated at flat metal contact regions called input/output (I/O) pads. Following manufacture, the integrated circuit is typically secured within a protective semiconductor device package. Each I/O pad of the chip is then connected to one or more terminals of the device package. The terminals of a device packages are typically arranged about the periphery of the package. Fine metal wires are typically used to connect the I/O pads of the chip to the terminals of the device package. Some types of device packages have terminals called "pins" for insertion into holes in a printed circuit board (PCB). Other types of device packages have terminals called "leads" for attachment to flat metal contact regions on an exposed surface of a PCB.

As integrated circuit fabrication technology improves, manufacturers are able to integrate more and more functions onto single silicon substrates. As the number of functions on a single chip increases, however, the number of signal lines which need to be connected to external devices also increases. The corresponding numbers of required I/O pads and device package terminals increase as well, as do the complexities and costs of the device packages. Constraints of high-volume PCB assembly operations place lower limits on the physical dimensions of and distances between device package terminals. As a result, the areas of peripheral-terminal device packages having hundreds of terminals are largely proportional to the number of terminals. These larger packages with fine-pitch leads are subject to mechanical damage during handling or testing. Mishandling can result in a loss of lead coplanarity, adversely affecting PCB assembly yields. In addition, the lengths of signal lines from chip I/O pads to device package terminals increase with the number of terminals, and the high-frequency electrical performance of larger peripheral-terminal device packages suffer as a result.

Unlike more conventional peripheral-terminal device packages, grid array semiconductor device packages have terminals arranged in a two-dimensional array across the underside surface of the device package. As a result, the physical dimensions of grid array device packages having hundreds of terminals are much smaller than their peripheral-terminal counterparts. Such smaller packages are highly desirable in portable device applications such as laptop and palmtop computers and hand-held communications devices such as cellular telephones. In addition, the lengths of signal lines from the chip I/O pads to device package terminals are shorter, thus the high-frequency electrical performances of grid array device packages are typically better than those of corresponding peripheral-terminal device packages. Grid array device packages also allow the continued use of existing PCB assembly equipment developed for peripheral-terminal devices.

An increasingly popular type of grid array device package is the ball grid array (BGA) device package. A BGA device includes a chip mounted upon a larger substrate substantially made of, for example, fiberglass-epoxy printed circuit board material or a ceramic material (e.g., aluminum oxide, alumina, $Al_2O_3$, or aluminum nitride, AlN). Many BGA device packages have die areas dimensioned to receive integrated circuit chips and use established wire bonding techniques to electrically connect the I/O pads of the chips to corresponding flat metal "bonding fingers" adjacent to the die areas. During wire bonding, the I/O pads of the chip are electrically connected to corresponding set of bonding pads arranged in a two-dimensional array across the underside surface of the device package. Members of the set of bonding pads are coated with solder and function as device package terminals. The resulting solder balls on the underside of the BGA device package allow the device to be surface mounted to an ordinary PCB. During PCB assembly, the solder balls are placed in physical contact with corresponding bonding pads of the PCB. The solder balls are then heated long enough for the solder to flow. When the solder cools, the bonding pads on the underside of the chip are electrically and mechanically coupled to the bonding pads of the PCB.

FIG. 1 is a top plan view of a typical BGA semiconductor device package 10. Semiconductor device package 10 includes a die area 12 dimensioned to receive an integrated circuit chip. Die area 12 is located substantially in the center of an upper surface of semiconductor device package 10. An underside surface of the integrated circuit chip is attached to semiconductor device package 10 within die area 12. The integrated circuit chip includes multiple input/output (I/O) pads arranged in rows about the periphery of an upper surface. Die area 12 is surrounded by a continuous ground ring 14 and a continuous power ring 16. Ground ring 14 is connected to an electrical ground potential at several points by vertical conductors (i.e., vias) 18, and power ring 16 is connected to a source of electrical power at several points by vias 20. Bonding fingers 22 of semiconductor device package 10 are arranged outside of power ring 16. Bonding wires are used to connect the I/O pads of the chip to ground ring 14, power ring 16, and corresponding bonding fingers 22. Electrically conductive signal traces connect bonding fingers 22 to bonding pads arranged upon an underside surface of semiconductor device package 10 with the help of vias. The bonding pads are coated with solder and function as device package terminals. For example, in FIG. 1, an electrically conductive signal trace 24 connects a bonding finger 26 to a via 28, and via 28 connects signal trace 24 to a solder-coated bonding pad on the underside surface of semiconductor device package 10.

Die area 12 is typically covered with a layer of an electrically conductive material (e.g., a flat metal sheet). The flat metal sheet is connected to ground ring 14 at multiple points by conductors 30. In addition, the flat metal sheet may be connected to dedicated grounding device package terminals by vias which extend from the flat metal plate on the upper surface to the device package terminals on the underside surface.

As greater levels of circuit integration cause an increase in the required numbers of bonding fingers and device package terminals, the routing of signal traces between bonding fingers 22 and device package terminals (e.g., solder-coated bonding pads) becomes more difficult. Two or more layers of signal traces may be required to route signals from bonding fingers 22 to the device package terminals. Additional signal layers make device packages more complex and expensive. In addition, more vias are necessary to connect signal traces on different levels. This presents a problem as signal traces have minimum width and spacing requirements, and must be routed between such vias.

It would be beneficial to have a semiconductor device package which includes additional bonding fingers and signal traces within an electrically conductive ring surrounding a die area for the routing of signals from I/O pads of an integrated circuit to device package terminals located on the underside surface. Such a semiconductor device package would greatly reduce the density of bonding fingers surrounding the conductive ring. In addition, the substantial amount of space typically existing between the conductive ring and the die area in a conventional device package would be better utilized, allowing the overall size of the semiconductor device package to be reduced. Such size reduction would be advantageous, especially in portable applications.

SUMMARY OF THE INVENTION

The problems outlined above are in large part solved by a semiconductor device package for housing an integrated circuit which includes additional bonding fingers located within (i.e., radially inside) a conductive ring structure and routed to device package terminals on an underside surface of the semiconductor device package. In one embodiment, the semiconductor device package has planar opposed upper and underside surfaces. The semiconductor device package includes a die area defined upon the upper surface, a continuous electrically conductive ring surrounding the die area, and a first set of bonding fingers arranged within the conductive ring (i.e., between the conductive ring and the die area). The die area is dimensioned to receive the integrated circuit. The conductive ring may be adapted for coupling to an electrical ground potential or a source of electrical power. The conductive ring and the first set of bonding fingers are located within a first signal layer adjacent to the upper surface. A set of bonding pads which serve as the device package terminals reside within a second signal layer adjacent to the underside surface, and may be coated with solder. The presence of the conductive ring prevents the routing of signals from members of the first set of bonding fingers to corresponding bonding pads located outside a region defined by the conductive ring using only signal traces within the first signal layer.

In order to route signals from members of the first set of bonding fingers to bonding pads lying outside the conductive ring, the semiconductor device package also includes a first set of signal traces connected to corresponding members of the first set of bonding fingers within the first signal layer, a second set of signal traces connected to corresponding members of the set of bonding pads within the second signal layer, and a first set of vias connecting members of the first set of signal traces to corresponding members of the second set of signal traces. The first set of signal traces and the first set of vias exist within the region defined by the conductive ring. Each member of the second set of signal traces originates within the region defined by the conductive ring and terminates at a bonding pad located outside the region. The signal traces and vias form signal paths between members of the first set of bonding fingers and corresponding members of the set of bonding pads which "loop back" upon themselves.

The semiconductor device package includes a substrate having multiple electrically conductive layers between planar opposed upper and underside surfaces. The conductive layers are electrically isolated from one another by the dielectric substrate material (e.g., fiberglass-epoxy composite or ceramic material). The first and second signal layers are adjacent to the respective upper and underside surfaces of the substrate and are patterned to form signal traces. The substrate also includes a continuous electrically conductive ground plane and a combined power and ground plane. The ground plane is adapted for coupling to an electrical ground potential and positioned between the first and second signal layers. A combined power and ground plane is positioned between the ground plane and the second signal layer, and includes a power portion and a ground portion. The power portion is adapted for coupling to a source of electrical power. The ground portion is adapted for coupling to the electrical ground potential. The ground portion of the combined power and ground plane includes regions adjacent to members of the second set of signal traces within the second signal layer such that the impedances of the signal paths formed between members of the first set of bonding fingers and corresponding members of the set of bonding pads remain substantially uniform.

In addition to the first set of bonding fingers, the semiconductor device package may include a second set of bonding fingers within the first signal layer and arranged outside of the conductive ring. In this case a third set of signal traces within the first signal layer, along with corresponding vias, are used to connect members of the second set of bonding fingers to corresponding members of the set of bonding pads.

The semiconductor device package may include two continuous electrically conductive rings: a ground ring and a power ring. The ground ring may, for example, The semiconductor device package may include two continuous electrically conductive rings: a ground ring and a power ring. The ground ring may, for example, encircle the die area, and the power ring may surround the ground ring. In this case the first set of bonding fingers are arranged between the ground ring and the die area, and the second set of bonding fingers are arranged outside of the power ring.

A semiconductor device employing the semiconductor device package includes an integrated circuit attached to the upper surface of the substrate within the defined die area. The integrated circuit includes at least one electronic device formed upon a monolithic semiconductor substrate, and has a plurality of input/output (I/O) pads arranged upon an upper surface. A set of bonding wires connect the I/O pads of the integrated circuit to corresponding bonding fingers of the substrate.

A method of packaging an integrated circuit in accordance with the present invention includes providing the integrated circuit and the semiconductor device package described above. The underside of the integrated circuit is attached to the upper surface of the substrate within the die area. A wire bonding technique is then used to connect members of the I/O pads of the integrated circuit to corresponding members of the bonding fingers using bonding wires.

BRIEF DESCRIPTION OF THE DRAWINGS

Other objects and advantages of the invention will become apparent upon reading the following detailed description and upon reference to the accompanying drawings in which.

Figure 1:
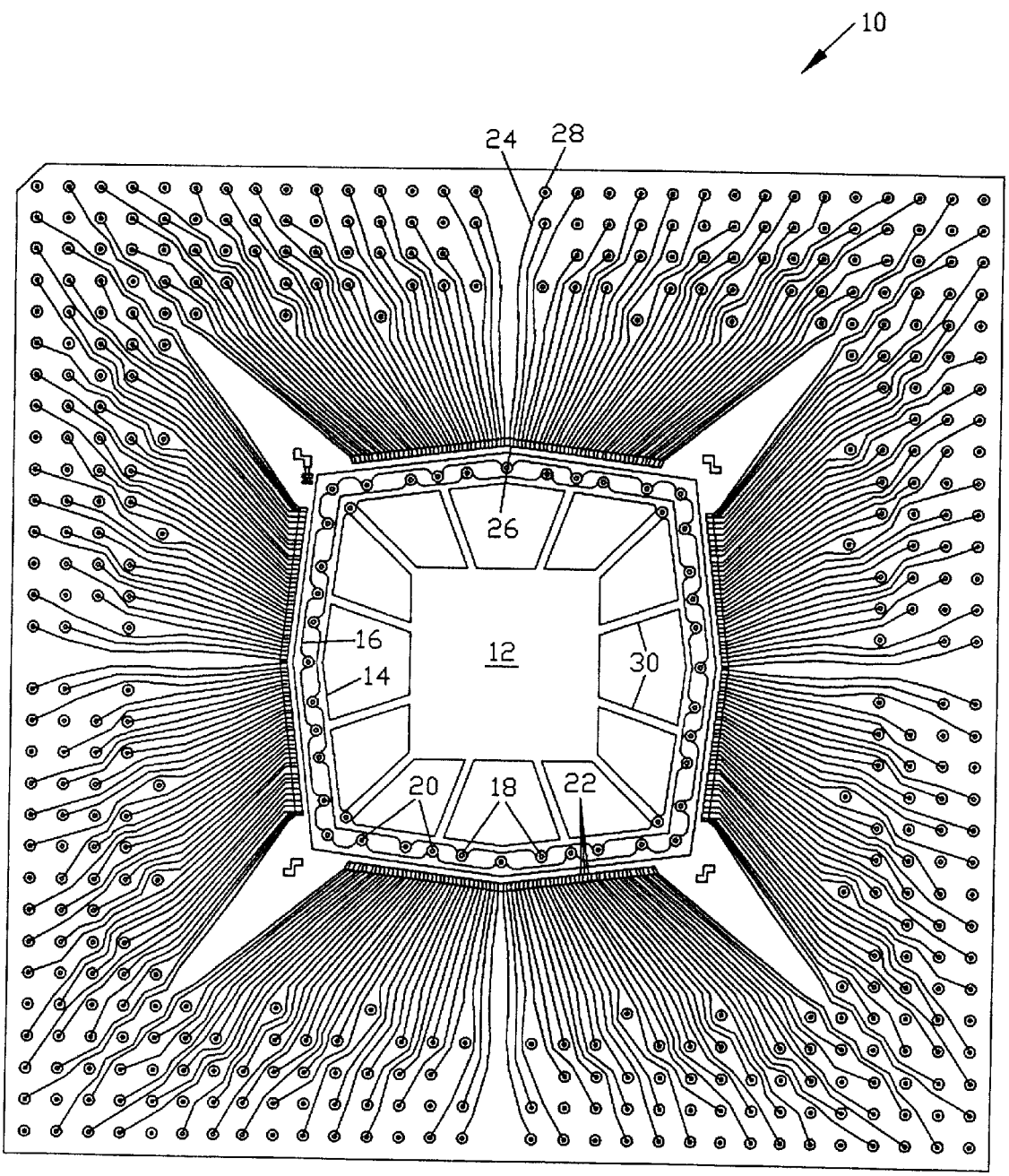
FIG. 1 is a top plan view of a typical BGA semiconductor device package, wherein the device package includes a die area, a ground ring surrounding the die area, a power ring surrounding the ground ring, and multiple bonding fingers arranged about the exterior of the power ring.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
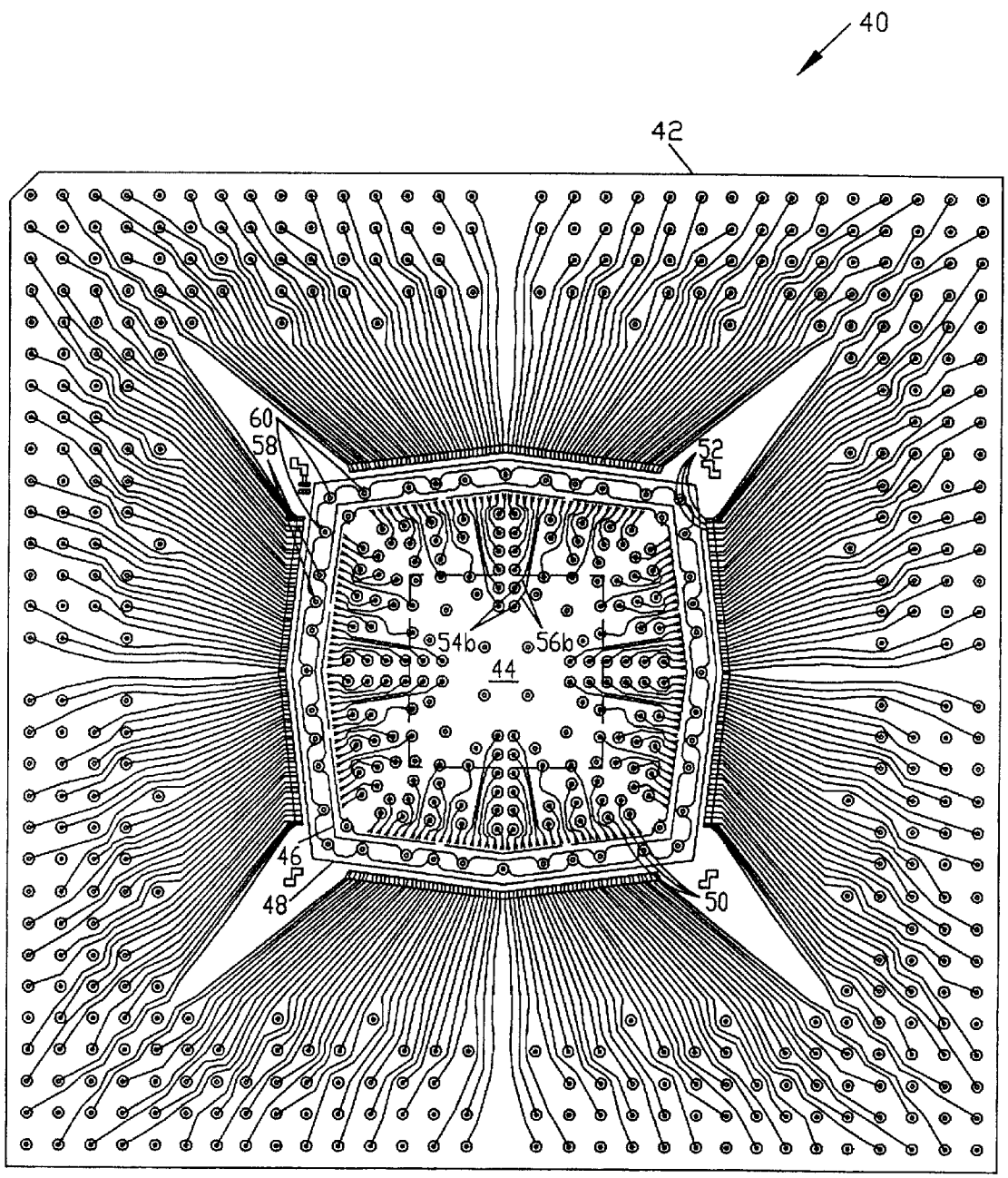
FIG. 2 is a top plan view of one embodiment of a semiconductor device package in accordance with the present invention, wherein the device package includes a die area defined upon an upper surface, a ground ring surrounding the die area, a power ring surrounding the ground ring, and two sets of bonding fingers: (i) a first set of bonding fingers arranged within the ground ring, and (ii) a second set of bonding fingers arranged outside of the power ring.

FIG. 2 is a top plan view of one embodiment of a semiconductor device package 40 in accordance with the present invention. Semiconductor device package 40 includes a substrate 42 having planar opposed upper and underside surfaces. The upper surface of substrate 42 includes a die area 44, a continuous ground ring 46, and a continuous power ring 48. Die area 44 is located substantially in the center of the upper surface. Die area 44 is dimensioned to receive an integrated circuit, and is surrounded by ground ring 46. Ground ring 46 is adapted for coupling to an electrical ground potential. Power ring 48 surrounds ground ring 46, and is adapted for coupling to a source of electrical power.

Substrate 42 also includes a first set of bonding fingers 50 and a second set of bonding fingers 52. The first set of bonding fingers 50 are arranged between die area 44 and ground ring 46, and the second set of bonding fingers 52 are arranged outside of power ring 50. In the embodiment of FIG. 2, die area 44, ground ring 46, and power ring 48 are substantially rectangular in shape. The first set of bonding fingers 50 are arranged substantially in rows between corresponding sides of die area 44 and ground ring 46, and the second set of bonding fingers 52 are arranged substantially in rows about the four sides of power ring 48.

Substrate 42 is preferably substantially fiberglass-epoxy printed circuit board material, however, should not be classified as a printed circuit board ("PCB") in the typical sense. Alternately, substrate 42 may substantially be, for example, a ceramic material (e.g., aluminum oxide or aluminum nitride).

Figure 3:
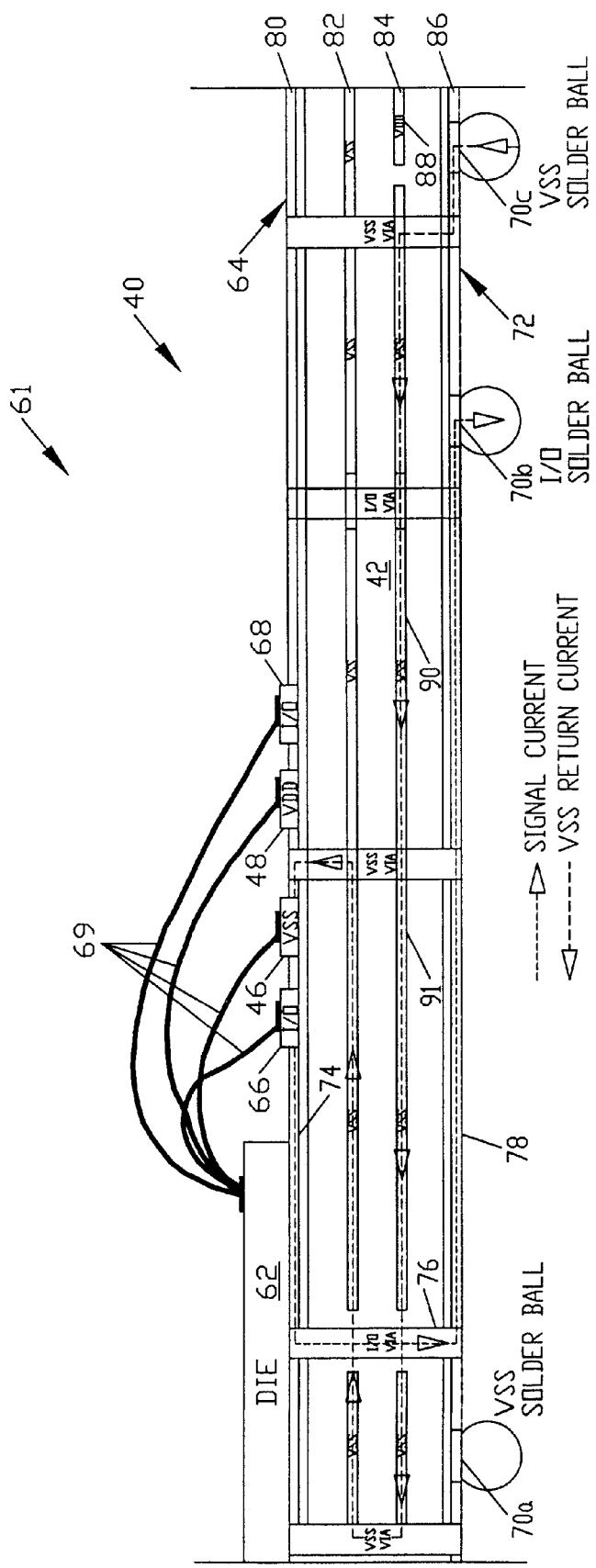
FIG. 3 is a partial cross-sectional view of one embodiment of an exemplary semiconductor device employing the semiconductor device package of FIG. 2, wherein a substrate of the semiconductor device package includes a first signal layer adjacent to an upper surface of the substrate, a second signal layer adjacent to an underside surface of the substrate, a continuous electrically conductive ground plane between the first and second signal layers, and a combined power and ground plane located between the ground plane and the second signal layer, wherein the combined power and ground plane includes a power portion and a ground portion, and wherein the ground portion is configured to stabilize the impedances of signal paths formed between bonding fingers within the first signal layer and corresponding bonding pads within the second signal layer.

FIG. 3 is a partial cross-sectional view of an exemplary semiconductor device 61 employing semiconductor device package 40. Semiconductor device 61 includes an integrated circuit die 62 having an underside surface attached to an upper surface 64 of semiconductor device package 40 within die area 44 (see FIG. 2). Integrated circuit die 62 includes one or more electronic devices formed upon a monolithic semiconductor substrate. Die 62 also includes multiple input/output (I/O) pads arranged about the periphery of an upper surface. Bonding wires 69 connect the I/O pads of die 62 to bonding finger 66, ground ring 46, power ring 48, and bonding finger 68. Bonding finger 66 is a member of the first set of bonding fingers 50, and bonding finger 68 is a member of the second set of bonding fingers 52. Bonding wires 69 may be installed using any one of a variety of well known wire bonding techniques. Solder-coated bonding pads 70a–c formed upon an underside surface 72 of semiconductor device package 10 function as device package terminals.

FIG. 3 illustrates an exemplary signal path 74 from bonding finger 66 to solder-coated bonding pad 70b located outside a region of substrate 42 defined by power ring 48. Bonding finger 66 exists within a first signal layer of substrate 42 adjacent to upper surface 64. Continuous ground ring 46 and power ring 48 are also formed within the first signal layer. The fact that bonding finger 66 is located within continuous rings 46 and 48, and bonding pad 70b lies outside of regions of substrate 42 defined by continuous rings 46 and 48, prevents the routing of signal path 74 substantially within the first signal layer. As a result, signal path 74 extends along a first signal trace which passes under die 62, down through via 76, and along a second signal trace 78 to solder-coated bonding pad 70b. Second signal trace 78 and bonding pad 70b are within a second signal layer of substrate 42 adjacent to underside surface 72.

The multiple bonding pads 70 formed within the second signal layer are preferably arranged in a two-dimensional array. Bonding pads 70 may be covered with solder as shown in FIG. 3, forming solder balls which function as terminals of semiconductor device package 40. Alternately, bonding pads 70 may have pins for connecting to a PCB or for inserting into a socket.

Exemplary signal path 74 loops back upon itself. A problem arises with such "loop back" signal paths in conventional device package configurations having continuous power and ground planes between the first and second signal layers. For example, the substrate of a conventional semiconductor device package may have four planar layers of electrically conductive material (i.e., planar conductor layers) arranged parallel to and between upper surface 64 and underside surface 72: a first signal layer including the first signal trace, a continuous ground ("$V_{SS}$") plane below the first signal layer, a continuous power ("$V_{DD}$") plane below the ground plane, and a second signal layer including second signal trace 78. In this case the first signal trace is closest to the ground plane, and second signal trace 78 is closest to the power plane. The result is a detrimental change in the electrical impedance of signal path 74 along its length which degrades signal transmission and the electrical performance of semiconductor device package 40.

The present invention overcomes this problem by employing a combined power and ground plane to minimize signal line impedance changes. In the embodiment of FIG. 3, substrate 42 includes four planar conductor layers arranged parallel to and between upper surface 64 and underside surface 72: a first signal layer 80, a ground plane 82, a combined power and ground plane 84, and a second signal layer 86. The four planar conductor layers may be made of, for example, copper or aluminum. A layer of the dielectric material of substrate 42 (i.e., fiberglass-epoxy or ceramic material) separates adjacent conductor layers, electrically isolating the conductor layers. Ground plane 82 is a continuous sheet of electrically conductive material. Combined power and ground plane 84 includes a power portion connected to the power supply and a ground portion connected to the ground potential. Combined power and ground plane 84 may be patterned from a continuous sheet of electrically conductive material such that the power and ground portions are electrically isolated from one another.

First signal layer 80 and second signal layer 86 include multiple signal traces, and may also be patterned from continuous sheets of electrically conductive material. Referring to FIGS. 2 and 3, first signal layer 80 includes ground ring 46, power ring 48, the first set of bonding fingers 50, and the second set of bonding fingers 52, in addition to signal traces which connect bonding fingers to vias. Ground ring 46 is electrically connected to ground plane 82 at several points by vias 58 and power ring 48 is connected to the power portion of combined power and ground plane 84 at several points by vias 60. Multiple vias within substrate 42 connect signal traces on first signal layer 80 to corresponding bonding pads 70 and signal traces on first signal layer 80 to signal traces on second signal layer 86.

In accordance with the present invention, ground portion 90 of combined power and ground plane 84 includes those regions located adjacent to signal paths originating from members of the first set of bonding pads 50 so that the electrical impedances of the corresponding signal paths are substantially uniform. The remainder of combined power and ground plane 84 is power portion 88. FIG. 3 also illustrates a "$V_{SS}$return" current path 91 within ground plane 82 and ground portion 90. A flow of $V_{SS}$return current through current path 91 results from a corresponding flow of signal current through signal path 74. As a result of the uniform impedance of signal path 74, the electrical performance of semiconductor device package 40 is substantially improved.

Figure 4:
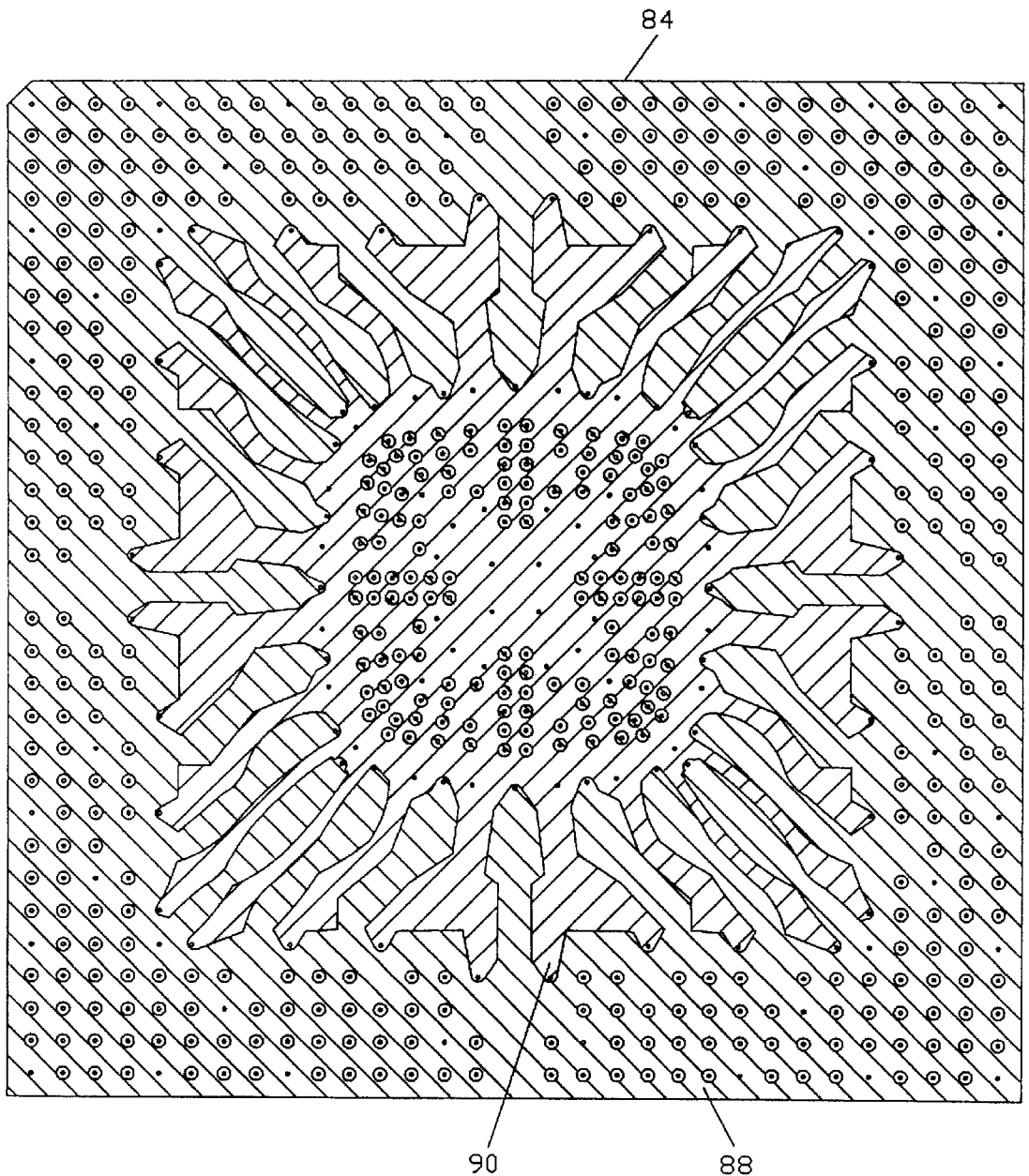
FIG. 4 is a top plan view of one embodiment of the combined power and ground plane of FIG. 3 illustrating the power and ground portions, wherein the power portion occupies a peripheral region of the combined power and ground plane, and wherein the ground portion occupies a central region of the combined power and ground plane, and wherein the ground portion has appendages which jut out into the power portion adjacent to signal traces existing within the second signal layer which are used to connect bonding fingers within the first signal layer and corresponding bonding pads within the second signal layer.

FIG. 4 is a top plan view of combined power and ground plane 84 illustrating power portion 88 and ground portion 90. Power portion 88 occupies a peripheral region of combined power and ground plane 84, and ground portion 90 occupies a central region. Ground portion 90 has appendages which jut out into power portion 88 adjacent to signal lines existing within second signal layer 86 and connected to members of the first set of bonding fingers 50. Vias dispersed within ground portion 90 connect ground portion 90 to ground plane 82 and help maintain ground portion 90 at the ground potential.

Figure 5:
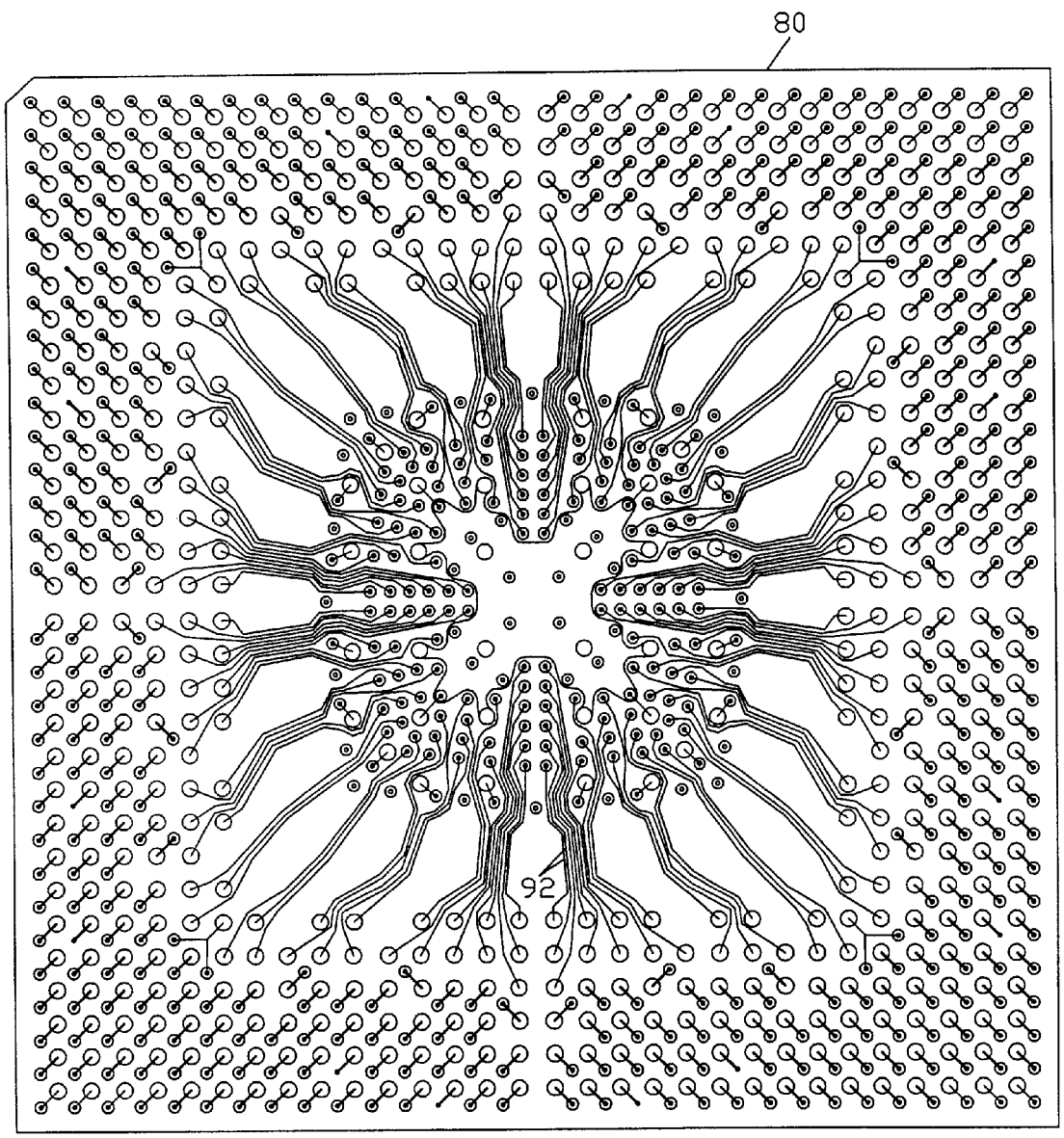
FIG. 5 is a top plan view of one embodiment of the second signal layer of FIG. 3 including signal traces used to connect bonding fingers within the first signal layer to corresponding bonding pads within the second signal layer.

FIG. 5 is a top plan view of one embodiment of second signal layer 86. Signal traces 92 within second signal layer 86 connected members of the first set of bonding fingers 50 to bonding pads 70 located on underside surface 72. In order to reduce signal trace length, bonding pads 70 located near the center of substrate 42 are preferably reserved for signal paths originating from members of the first set of bonding fingers 50. Ground portion 90 of combined power and ground plane 84 (see FIGS. 3 and 4) includes regions of combined power and ground plane 84 adjacent to signal traces 92.

During assembly of semiconductor device 61 of FIG. 3, the underside surface of integrated circuit 62 is attached to the upper surface 64 of substrate 42 within die area 44 using any one of various and well know die attach methods (e.g., epoxy adhesive). A wire bonding technique is then used to connect the I/O pads on the upper surface of integrated circuit die 62 to ground ring 46, power ring 48, and corresponding members of the second set of bonding fingers 52 and the first set of bonding fingers 50. Following wire bonding, the upper surface of substrate 42 may be covered with an encapsulant material or a lid.

Numerous variations and modifications will become apparent to those skilled in the art once the above disclosure is fully appreciated. It is intended that the following claims be interpreted to embrace all such variations and modifications.

I claim:
1. A semiconductor device package comprising:
   a substrate with opposed upper and underside surfaces:
   a die disposed upon the upper surface of the substrate, the die having a plurality of bond pads:
   a first signal layer adjacent to the upper surface of the substrate comprising:
      a plurality of bonding fingers;
      a plurality of first signal traces separated from one another, each of the plurality of first signal traces connected to a corresponding one of the bonding fingers, at least a portion of each of the first signal traces extending along the upper surface ol the substrate underneath the die;
      a plurality of bonding wires, each of the plurality of bonding wires connecting a corresponding one of the plurality of bond pads to a corresponding one of the plurality of bonding fingers, wherein a first one of the plurality of bonding wires is connected to a first one of the plurality of bond pads, wherein the first one of the plurality of bond pads corresponds to an input/output signal that is not a power or ground signal;
   a second signal layer, comprising a plurality of second signal traces;
   a plurality of vias, each connecting a corresponding one of the plurality of first signal traces to a corresponding one of the second signal traces such that a signal path is formed between the bonding fingers and the second signal traces;
   a conductive ring disposed on the upper surface of the substrate, wherein the bonding fingers are disposed between the die and the conductive ring;
   a conductive ground plane positioned between the first and second signal layers; and
   a combined power and ground plane positioned between the ground plane and the second signal layer.

2. The semiconductor device package according to claim 1 wherein the second signal layer is adjacent to the underside surface of the substrate.

3. The semiconductor device package according to claim 1 wherein a plurality of the plurality of bonding wires are connected to corresponding bond pads that correspond to input/output signals that are not power or ground signals.

4. The semiconductor device package according to 1 further comprising a solder ball disposed on the underside surface such that the solder ball is not directly underneath the die, wherein the solder ball is connected to one of the plurality of second signal traces such that the solder ball is electrically coupled to one of the first plurality of traces that is electrically coupled to a bond pad that corresponds to an input/output signal that is not a power or ground signal.

\* \* \* \* \*